United States Patent [19]

Pohl

[11] 4,415,654

[45] Nov. 15, 1983

[54] POST-EXPOSURE PROCESS

[75] Inventor: Rudolph L. Pohl, Landenberg, Pa.

[73] Assignee: Hercules Incorporated, Wilmington, Del.

[21] Appl. No.: 409,699

[22] Filed: Aug. 19, 1982

[51] Int. Cl.³ .............................................. G03C 5/14
[52] U.S. Cl. .................................... 430/328; 430/309; 430/331
[58] Field of Search ....................... 430/328, 309, 331; 427/54.1, 53.1

[56] References Cited

U.S. PATENT DOCUMENTS 3,051,603  8/1962  Michaels .............................. 430/309
3,061,595  10/1962  Dorion et al. ...................... 260/80.5
3,723,120  3/1973  Hummel ................................ 96/35.1

FOREIGN PATENT DOCUMENTS 727557  2/1966  Canada .................................... 96/22

Primary Examiner—John E. Kittle
Assistant Examiner—Cynthia Hamilton
Attorney, Agent, or Firm—Jeffrey F. Craft

[57] ABSTRACT

Disclosed is the improvement in post-exposing relief printing plates prepared from photosensitive polymeric compositions which comprises immersing the relief printing plate in a dilute aqueous solution of a persulfate salt and a sufficient amount of a water-soluble carboxylic acid to provide a pH of about 1.5 to about 2.5 during exposure to actinic radiation.

3 Claims, No Drawings

POST-EXPOSURE PROCESS

BACKGROUND OF THE INVENTION

This invention relates to an improved method for the post-exposure of polymeric printing plates. More particularly, this invention relates to post-exposing polymeric relief printing plates, where the improvement comprises postexposing the plate to actinic radiation while the plate is immersed in a dilute aqueous solution of a persulfate salt and a sufficient amount of a water-soluble carboxylic acid to produce a pH of about 1.5 to about 2.5.

It is known in the printing art to provide for the rapid preparation of lightweight polymeric relief printing plates. Such relief printing plates can be prepared by exposing a layer of photosensitive polymeric composition to actinic radiation through a transparency bearing the image which it is desired to reproduce, washing away or otherwise removing the unexposed soluble photosensitive composition leaving an insolubilized relief image. Especially in the case of relief printing plates prepared from liquid photosensitive polymeric compositions, the non-printing area of the relief elements is tacky.

In order to decrease the tackiness and increase the hardness, particularly, in the non-printing area, it is common practice to post-expose the entire surface of the plate to actinic radiation, thereby completely hardening it and rendering the surface non-tacky. Since oxygen in the atmosphere tends to delay the post-exposure photoreaction, it is most desirable to exclude oxygen. Various methods have been proposed for the exclusion of oxygen. One method consists of conducting the post-exposure in an inert atmosphere, such as nitrogen or carbon dioxide. Another method consists of covering the surface with some type of transparent film. Another method is to coat the plate with a film or membrane-forming solution or emulsion, such as an aqueous solution of gum arabic or carboxymethyl cellulose. Still another method (as shown in U.S. Pat. No. 3,723,120) involves post-exposing a photopolymer plate under water. Unfortunately, all of the above methods suffer serious drawbacks. The method of post-exposing under water, for example, requires an excessive amount of time to reduce tack.

More recently, it has become known that these drawbacks can be partially overcome by post exposing a photopolymer plate under a dilute aqueous solution of a persulfate salt. However, even where a persulfate salt solution is employed, the tack reduction is slow, erratic and incomplete.

SUMMARY OF THE INVENTION

It has now surprisingly been found that polymeric printing plates can be rapidly and effectively post-exposed when immersed in a dilute aqueous solution containing a mixture of a persulfate salt and a water-soluble carboxylic acid where the water-soluble carboxylic acid is present in sufficient quantity to provide a the pH of about 1.5 to about 2.5. Unlike an aqueous solution containing only persulfate salt, when a water-soluble carboxylic acid is present in an amount sufficient to reduce the pH to 2.5 or below, the efficiency of the post exposure conversion to a tack-free surface is greatly increased.

DETAILED DESCRIPTION OF THE PREFERRED EMBODIMENTS

Any aqueous solution containing from about 1% to about 20%, most preferably from about 2% to about 10%, by weight of a water-soluble persulfate salt and containing sufficient water-soluble carboxylic acid to reduce the pH to a value from about 1.5 to about 2.5 can be used in the process of this invention.

Typical persulfate salts which are used in the process of this invention are the water-soluble ammonium, potassium, sodium, barium, and lead salts; with ammonium, potassium and sodium salts being preferred.

The persulfate salt can be used at a concentration up to the limits of its solubility in water at room temperature. However, the use of very high concentrations of persulfate salts is not recommended inasmuch as absorption of the actinic radiation by the solution appreciably reduces the intensity of the radiation reaching the solution-polymer interface, thereby increasing the time required to effect post-curing. Consequently, while any salt concentrations between 1% and 20% may be used, the preferred concentrations are in the range of about 2–10%.

Typical water-soluble carboxylic acids useful in the process of this invention include oxalic, acetic, lactic, glycolic, citric, propionic, malonic, tartaric and methoxyacetic acids. Sufficient water-soluble carboxylic acid is added to give a pH of about 1.5 to about 2.5. Mineral acids, such as sulfuric, hydrochloric or nitric are not useful, even when added in sufficient quantity to reduce the pH to less than 2.5.

The process of this invention can be used with any relief printing plate system in which post-exposure is required or desirable. For example, this invention can be used in preparing plates with any of the well-known photosensitive polymeric compositions. Basically, most photosensitive polymeric compositions contain four components: (1) a binder of some type, generally a polymer, prepolymer or resin, (2) a hardening and insolubilizing material, generally a crosslinking agent or polymerizable monomer, (3) a photosensitive initiator and (4) a thermal stabilizer.

Typical binders include unsaturated polyesters, such as those described in U.S. Pat. Nos. 3,794,494 and 3,858,510; polyurethanes, such as those described in U.S. Pat. No. 3,960,572; and telechelic polymers containing terminal unsaturation.

Typical hardening and insolubilizing materials include mono- and polyfunctional monomers, such as acrylic acid, methacrylic acid, methyl methacrylate, ethyl acrylate, n-propyl acrylate, isopropyl acrylate, n-hexyl acrylate, n-octyl acrylate, cyclohexyl acrylate, allyl acrylate, glycidyl acrylate, styrene, vinyltoluene, divinyl benzene, carboxystyrene, diallyl phthalate, triallyl cyanurate, vinyl acetate, acrylamide, methacrylamide, N-methylolacrylamide, diacetone acrylamide, N-methylolmethacrylamide, N-methoxymethylacrylamide, N-ethoxymethylacrylamide, N-ethoxy-methylmethacrylamide, N-n-butoxymethylacrylamide, N,N'-methylene bisacrylamide, N,N'methylene bismethacrylamide, N,N'-trimethylene bisacrylamide, N,N'-hexamethylene bisacrylamide, 2-hydroxyethyl-acrylate, 2-hydroxyethylmethacrylate, lauryl methacrylate, 2-hydroxypropylacrylate, 3-chloro-2-hydroxypropylacrylate, 4-hydroxybutylacrylate, diethylene glycol monoacrylate, diethylene glycol dimethacrylate, dipropylene glycol monoacrylate, polyethylene glycol monoacrylate, polyethylene glycol dimethacrylate, ethylene glycol diacrylate, tetraethylene glycol diacrylate, tetraethylene glycol dimethacrylate, propylene glycol dimethacrylate, trimethylolpropane triacrylate and trimethylolpropane trimethacrylate.

The photosensitive initiator used will depend upon the other three components as well as the light source employed. Typical photosensitive initiators include benzoins, such as benzoin, benzoin methyl ether, benzoin ethyl ether, benzoin isobutyl ether, α-methylbenzoin, α-ethylbenzoin, α-phenylbenzoin, α-allylbenzoin, etc.; anthraquinones, such as anthraquinone, chloroanthraquinone, methylanthraquinone, ethylanthraquinone, the diketones, such as benzil, diacetyl, phenones, such as acetophenone, benzophenone, α-bromoacetophenone, diethoxy acetophenone, dimethoxy phenyl acetophenone, disulfides, such as diphenyldisulfide, tetraethylthiuramidsulfide, and 2-naphthalenesulfonyl chloride.

Typical thermal stabilizers included di-t-butyl-p-cresol, hydroquinone monomethylether, pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, hydroquinone monopropyl ether, phenothiazine and nitrobenzene, used separately or in combination.

Preferred photosensitive polymeric compositions are liquid compositions made with the following components: (1) a binder of an acrylic or methacrylic chain terminated telechelic polymer such as a homopolymer of butadiene or isoprene or a copolymer of butadiene and acrylonitrile, (2) a hardening and insolubilizing material consisting of one or more ethylenically unsaturated monomers each containing one or more

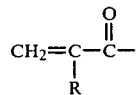

radicals where R is H or methyl and where the hardening and insolubilizing material is present in an amount from about 1 to 50% based on the weight of the binder, (3) a photoinitiator present from about 0.1 to 10% by weight based on the weight of the binder and (4) a thermal stabilizer present from about 0.01 to 1% based on the weight of the binder.

Those skilled in the art will realize that the number of basic components can be more than four, as is the case when a mixture of two or more materials is used for one of the above components. Likewise, the number of basic components can be less than four when one of the components performs the functions of two or more components. As is well known in the art, in addition to the four basic components, the photosensitive composition may also contain fillers, plasticizers, etc.

As stated above, the relief printing plate is prepared by first exposing a layer of the photosensitive polymeric composition to actinic radiation through a transparency bearing the image. The type and intensity of the actinic radiation primarily depend upon the specific photosensitive polymeric composition used. Next, the unexposed soluble photosensitive composition is removed by a method such as washing or blowing the relief printing plate with an air jet, leaving an insolubilized relief image and a tacky background.

The plate is then immersed in a dilute solution of persulfate salt and sufficient water-soluble carboxylic acid to give to give a pH of about 1.5 to about 2.5. The depth of the solution affects the intensity of the actinic radiation reaching the photopolymer surface. The deeper the solution, the less the intensity and the greater the time required to post-expose the relief printing plate. Thus, while solution depths from 0.1 in. to 5 in. may be used, the preferred depths are 0.5 in. to 1.5 in. Post-exposure will generally be carried out with actinic radiation having a wave length of from about 200 nm to about 800 nm. Practical sources for such radiation are carbon arc lamps, high-pressure mercury lamps, ultraviolet fluorescent lamps, xenon lamps, etc. The specific radiation used will depend upon the specific photosensitive polymeric composition used. The post-exposure time will vary from about 10 seconds to about 20 minutes, most preferably from about 60 seconds to about 10 minutes. The resulting relief printing plate will be hard, strong and tack-free.

The following examples are presented for purposes of illustration. Parts and percentages are based on weight unless otherwise specified.

EXAMPLES

Example 1 (Control)

A polybutadiene based photopolymer is prepared as follows: Into a round bottom flask fitted with a stirrer, a reflux condenser, and an air sparge tube, is charged 3270 pars of a carboxyl terminated polybutadiene (sold by B. F. Goodrich Co. under the trademark "Hycar CTB"-2000X162) and 2.61 parts of sodium methoxide catalyst. The mixture is heated with stirring while a stream of dry air is passed through. When the temperature reaches 100° C., 229 parts of glycidyl methacrylate are added, along with a mixture of thermal stabilizers comprising 0.26 part nitrobenzene, 0.49 part phenothiazine and 6.55 parts of di-tert-butyl-para-cresol. The reaction mixture is maintained at a temperature of 100° C. for 11 hours. This results in a terminally unsaturated binder stabilizer which has an acid number of 2.8 and a Brookfield viscosity of 92,410 cps. measured with a number 3 spindle at 25° C. and 10 rpm.

A portion of the above prepared polymer, comprising 3087 parts, is stirred together with the hardening and insolubilizing material, a mixture of unsaturated monomers comprising 210.5 parts of 1,6-hexanediol dimethacrylate and 210.5 parts of lauryl methacrylate and with the photoinitiator, 140.3 parts of 2,2-diethoxyacetophenone. This mixture is stirred at room temperature for 1 hour, at which time it is completely homogeneous. The resulting photopolymer composition has a Brookfield viscosity measured at 25° C. of 21,200 cps.

A photopolymer printing plate is made by sandwiching 112 mil of the polybutadiene based photopolymer composition between a transparent 4 mil polyester substrate and a 1 mil transparent polypropylene superstratum. A transparency bearing image is placed above the polypropylene superstratum.

The photopolymer printing plate is exposed using two banks of 40 watt uv fluorescent lamps. One bank is located 10 cm below the polyester substrate and the other bank is located 10 cm above the polypropylene superstratum. A first exposure, for 45 seconds at room temperature, is made using the bank located below the polyester substrate. This forms a relief printing plate background by hardening about 75 mil of the photopolymer composition in contact with the substrate. Then, using the second bank of lights, a second exposure, for two minutes at room temperature, is made through the transparency bearing image and the propropylene superstratum. This second exposure results in the formation of the relief image.

The resin in contact with the polypropylene, which was not exposed and consequently did not form a relief image, is washed away with a mild aqueous anionic detergent solution. A replica of the transparency bearing image is left in relief. The background of the plate are tacky.

The plate is immersed in a tray of 5% solution of sodium persulfate to a depth of 1 inch, and post exposed beneath a bank of ultraviolet fluorescent lamps at a distance of 3.5 inch, the lamp intensity being 1.5 mW/cm$^2$ as measured with an ultraviolet meter sensitive to light of 300-400 nm. The plate is exposed for 6 min., removed from the bath, and dried in a current of warm air. Although slightly hardened, the background remains tacky.

Example 2

A relief printing plate is prepared from the resin of Example 1 in a manner similar to that described in Example 1. After the unexposed resin is washed away, the plate is immersed in a tray of aqueous solution containing 5% by weight of sodium persulfate and 3% by weight of acetic acid. The pH of the solution is 2.5. The plate is then post exposed beneath a bank of ultraviolet lamps as described in Example 1 for 6 minutes. On drying the plate the background is non-tacky.

Examples 3-7

A series of relief printing plates are prepared as described in Example 1 and post exposed beneath a 1-inch depth of the solutions containing the different acids outlined in Table 1. The results, on drying, are shown in Table 1, along with the results of Examples 1 and 2.

TABLE 1
EFFECT OF VARIOUS ORGANIC ACIDS ON THE ABILITY OF SODIUM PERSULFATE SOLUTIONS TO REMOVE THE TACK FROM PHOTOPOLYMER PRINTING PLATES

| Example No. | Acid | % Wt. Acid in 5% Aqueous Solution Persulfate Soln. | Post Exposure Time (min) | pH | Tack Level[a] |
|---|---|---|---|---|---|
| 1 | — | — | 6 | 8.56 | 5 |
| 2 | acetic | 3.0 | 6 | 2.50 | 1 |
| 3 | oxalic | 1.0 | 6 | 2.30 | 2 |
| 4 | lactic | 1.0 | 6 | 2.30 | 1 |
| 5 | glycolic | 2.0 | 6 | 2.30 | 1 |
| 6 | citric | 0.7 | 6 | 2.40 | 1 |
| 7 | sulphuric | 0.24 | 6 | 2.0 | 5 |

[a]Tack level of 1 means no tack to the touch while a 5 rating is extremely tacky.

What I claim and desire to protect by Letters Patent is:

1. In the process of post-exposing to actinic radiation a relief printing plate prepared from a photosensitive polymeric composition, the improvement which comprises said relief printing plate being immersed during said post-exposing in a dilute aqueous solution of a persulfate salt and a sufficient amount of a water-soluble carboxylic acid to produce a pH of about 1.5 to about 2.5.

2. The process of claim 1 wherein said actinic radiation is ultraviolet radiation.

3. The process of claim 1 wherein said photosensitive polymeric composition is a liquid.

* * * * *